United States Patent
Chen

(10) Patent No.: US 6,504,759 B2
(45) Date of Patent: Jan. 7, 2003

(54) DOUBLE-BIT NON-VOLATILE MEMORY UNIT AND CORRESPONDING DATA READ/WRITE METHOD

(75) Inventor: Chin-Yang Chen, Chilung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 10/075,015

(22) Filed: Feb. 13, 2002

(65) Prior Publication Data

US 2002/0105830 A1 Aug. 8, 2002

Related U.S. Application Data

(62) Division of application No. 09/788,017, filed on Feb. 15, 2001, now abandoned.

(30) Foreign Application Priority Data

Feb. 8, 2001 (TW) .......................................... 90102758 A

(51) Int. Cl.[7] .............................................. G11C 16/04
(52) U.S. Cl. .............................. 365/185.18; 365/185.22
(58) Field of Search ........................ 365/185.18, 185.22, 365/185.01

(56) References Cited

U.S. PATENT DOCUMENTS 5,856,222 A * 1/1999 Bergemont et al. ......... 438/258
6,026,017 A * 2/2000 Wong et al. ........... 365/185.05
6,136,649 A * 10/2000 Hui et al. .................... 438/257
6,177,315 B1 * 1/2001 Bergemont et al. ......... 438/258

* cited by examiner

Primary Examiner—Hoai Ho
(74) Attorney, Agent, or Firm—Charles C. H. Wu; Wu & Cheung, LLP

(57) ABSTRACT

A double-bit non-volatile memory cell structure and a method of programming the memory cell. The memory cell includes a pair of stacked gates above a substrate, a doped region in the substrate between the stacked gate pair and a source/drain region in the substrate on each side of the stacked gate pair. The source/drain regions and the doped region are doped identically. To write data into the memory cell, the channel underneath both stacked gates is opened simultaneously. Data is written into the desired floating gate by controlling current flow direction. To read data from a first floating gate of the memory cell, a read bias voltage is applied to the first control gate above the first floating gate. In the meantime, a transfer voltage is applied to the second control gate. The presence or the absence of a conductive channel between the source/drain regions indicates whether data has been written into the first floating gate or not. The read bias voltage is greater than the threshold voltage of the first/the second floating gate in the erased state but smaller than the threshold voltage in the written state. The transfer voltage is greater than the threshold voltage in the written state.

1 Claim, 2 Drawing Sheets

DOUBLE-BIT NON-VOLATILE MEMORY UNIT AND CORRESPONDING DATA READ/WRITE METHOD

CROSS-REFERENCE TO RELATED APPLICATION

This application claims the priority benefit of Taiwan application serial no. 90102758, filed Feb. 8, 2001.

The Divisional of application No. 09/788,017 filed on Feb. 15, 2001 now abandoned.

BACKGROUND OF THE INVENTION

1. Field of Invention

The present invention relates to a semiconductor device and its method of operation. More particularly, the present invention relates to a double-bit non-volatile memory (NVM) unit and a data read/write method for the double-bit NVM unit.

2. Description of Related Art

Non-volatile memory (NVM) is a type of fast access, miniature, power-saving, vibration-resistant and permanent storage media. Thus, the applications of NVM are wide. A prominent type of NVM is the flash memory. One major aspect of the flash memory is the capacity for block-by-block data erasure so that time is saved.

FIG. 1 is a schematic cross-sectional view showing the structure of a conventional non-volatile memory cell. As shown in FIG. 1, the non-volatile memory cell includes a stacked gate structure 110 over a substrate 100. A source/drain region 120 is formed in the substrate 100 on each side of the stacked gate structure 110. The stacked gate structure 110 further includes, from bottom to top, a tunnel oxide layer 112, a floating gate 114, an inter-gate dielectric layer 116 and a control gate 118. During programming, electrons are injected into the floating gate 114. To erase data, a high negative bias voltage is applied to the control gate 118 and hence electrons are channeled away from the floating gate 114.

However, in order to remove all electrons from the floating gate 114, over-erase of the aforementioned non-volatile memory cell often occurs. In other words, too many electrons may be forced out of the floating gate 114 during erasure, resulting in the accumulation of some positive charges in the floating gate 114. In the presence of excess positive charges, an inversion of the channel underneath the floating gate 114 may occur and ultimately this may lead to a permanent opening of the channel and possible data read errors.

To resolve the issue, a split gate structure is developed. FIG. 2 is a schematic cross-sectional view of a non-volatile cell having a conventional split-gate structure. As shown in FIG. 2, a split-gate structure 210 is formed over a substrate 200. A source/drain region 220 is formed in the substrate 200 on each side of the split gate structure 210. The split-gate structure 210 includes, from bottom to top, a tunnel oxide layer 212, a floating gate 214, an inter-gate dielectric layer 216, a control gate 218 and a transfer gate 218a. The transfer gate 218a extends from the control gate 218 to the side of the floating gate 214. In addition, both the transfer gate 218a and the floating gate 214, as well as the transfer gate 218a and the substrate 200, are separated by the inter-gate dielectric layer 216. In this type of design, the channel under the transfer gate 218a is opened up only when a voltage is applied to the control gate 218/transfer gate 218a. Hence, even if the channel underneath the floating gate 214 is permanently opened due to over-erase, the two source/drain regions 220 of the memory cell are still in a non-conductive state, thereby preventing data read errors.

Although the split-gate structure 210 is able to prevent errors due to over-erase, the design has an adverse effect on miniaturization. This is because the transfer gate 218a needs to occupy extra area. In addition, the combined width of the control gate 218 and the transfer gate 218a inside the split-gate structure 210 is different from the floating gate 214. The floating gate 214 and the control gate 218/transfer gate 218a must be patterned in two separate photolithographic processes. Consequently, alignment problems between the floating gate 214 and the control gate 218/transfer gate 218a may occur, leading to possible overlapping area errors between the control gate 218/transfer gate 218a and the floating gate 214. Ultimately, electrical performance of each memory cell may be different and control of the memory cells may be difficult.

SUMMARY OF THE INVENTION

Accordingly, one object of the present invention is to provide a double-bit non-volatile memory cell capable of preventing over-erase problems. The cell includes a substrate, a pair of stacked gates, a doped region, a source region and a drain region. Each stacked gate includes, from bottom to top, a tunnel oxide layer, a floating gate, an inter-gate dielectric layer and a control gate. The doped region is located in the substrate between the two stacked gates. The source/drain regions are formed in the substrate on each side of the stacked gate pair. The source/drain regions and the doped region are doped identically.

This invention also provides a method of programming the said double-bit non-volatile memory cell. To write data into the first floating gate of the first stacked gate, a bias voltage is applied to the first and the second control gate of the first and the second stacked gate respectively. The channel underneath the first and the second floating gate is opened. In the meantime, a different bias voltage is applied to the respective source/drain regions so that electrons flow from the channel underneath the second floating gate to the channel underneath the first floating gate. The electrons obtain sufficient energy and produce hot electrons that are injected into the first floating gate.

This invention also provides an alternative method of programming the said double-bit non-volatile memory cell. To write data into the first floating gate of the first stacked gate, a higher bias voltage is applied to the first control gate of the first stacked gate. In the meantime, a lower bias voltage is also applied to the source/drain region on one side of the first stacked gate so that electrons move into the first floating gate via the source/drain region.

This invention also provides an alternative method of reading data from the said double-bit non-volatile memory cell. In this memory cell, the threshold voltage (the voltage at the control gate when the channel of the stacked gate is opened) of the channel underneath any stacked gate in the erased state is referred to as a first threshold voltage. Threshold voltage of the channel underneath any stacked gate in the written state is referred to as a second threshold voltage. The second threshold voltage is higher than the first threshold voltage. To read data stored in the first floating gate of the first stacked gate, a read bias voltage is applied to the first control gate of the first stacked gate. The read bias voltage is higher than the first threshold voltage but lower than the second threshold voltage. In the meantime, a transfer bias voltage is applied to the second control gate of the second stacked gate. The transfer bias voltage is higher than the second threshold voltage so that the channel underneath the second floating gate is forced open. Whether the first floating gate is in the written state or not is determined by the channel between the respective source/drain regions. If the channel between the source/drain region is conductive, data has not been written into the first floating gate. On the contrary, if the channel is non-conductive, data has been written into the floating gate.

The double-bit non-volatile memory of this invention uses two stacked gates but only a pair of source/drain regions. Therefore, a conductive channel is formed joining the two source/drain regions only when the channel underneath both the first and the second floating gates is opened. Since the probability of having both floating gates over-erased is small, the chance of maintaining a permanent channel between the source/drain terminals is slim. Thus, errors in data determination are greatly reduced. Moreover, one of the stacked gates can be regarded as a transfer gate because the transfer gate actually prevents the other transfer gate from being over-erased.

In addition, the double-bit memory cell is capable of holding two binary bits with one stacked gate serving as the transfer gate of the other stacked gate. Unlike the cell of a conventional split-gate having an additional transfer gate on one side of the control gate, the area for holding each bit is smaller. Furthermore, unlike a conventional split-gate design that demands a patterning of the floating gate before patterning the control gate and the transfer gate together, one stacked gate serves as the transfer gate of the other stacked gate in this invention. Hence, the floating gate and the control gate may be produced by a self-alignment method so that any non-conformity between different electrical devices is minimized.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
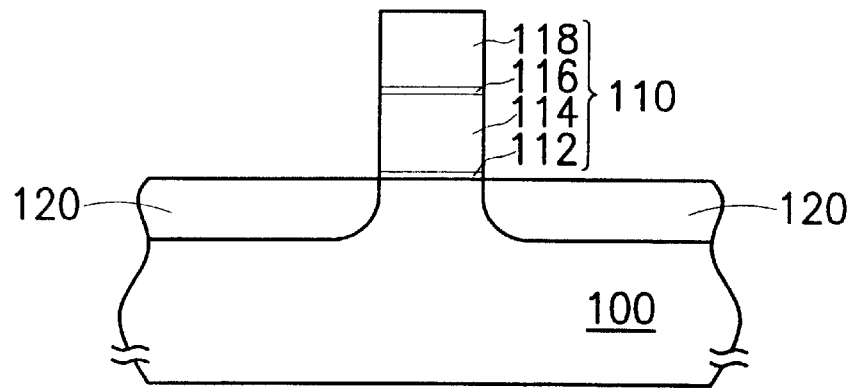
FIG. 1 is a schematic cross-sectional view showing the structure of a conventional non-volatile memory cell.
Figure 2:
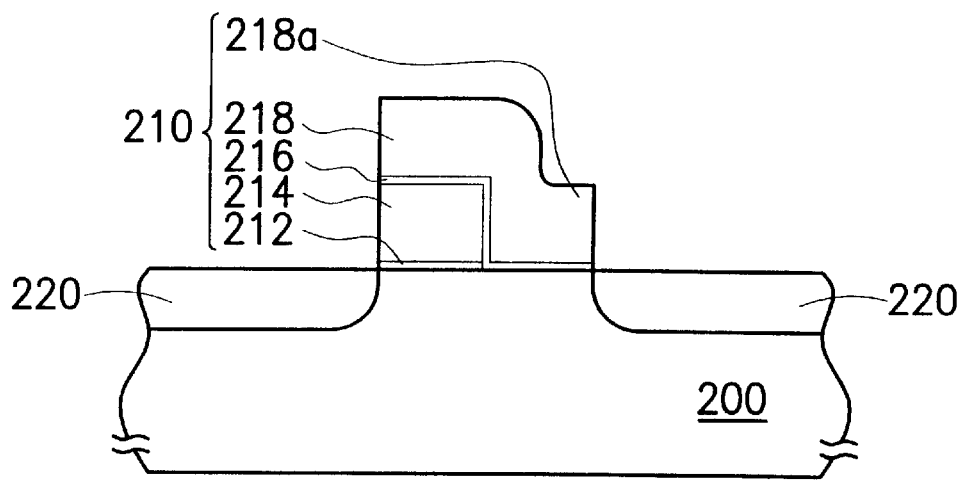
FIG. 2 is a schematic cross-sectional view of a non-volatile cell having a conventional split-gate structure.

Reference will now be made in detail to the present preferred embodiments of the invention, examples of which are illustrated in the accompanying drawings. Wherever possible, the same reference numbers are used in the drawings and the description to refer to the same or like parts.

The following is a description of a double-bit non-volatile memory cell structure, two programming methods and a reading method according to this invention. The double-bit non-volatile memory cell can be applied to a flash memory, for example.

Figure 3:
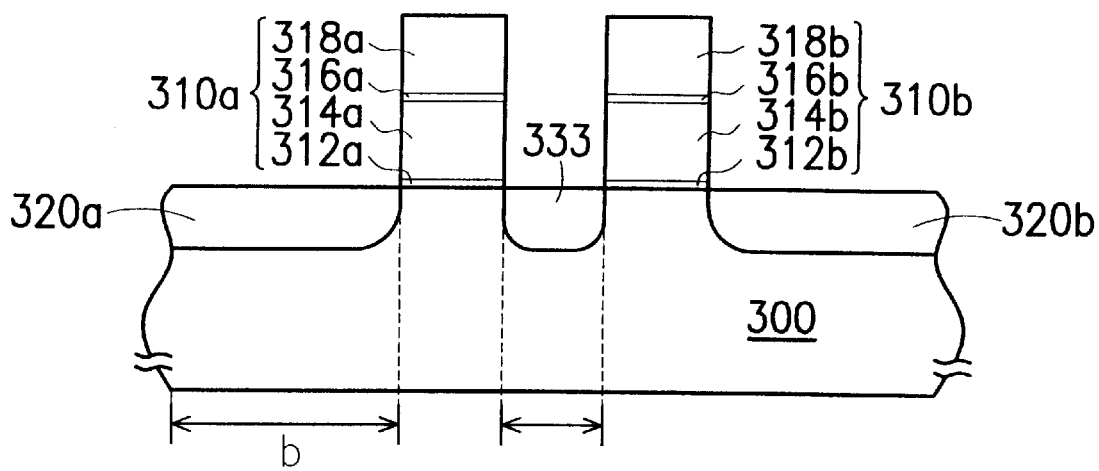
FIG. 3 is a schematic cross-sectional view of a double-bit non-volatile memory cell according one preferred embodiment of this invention.

FIG. 3 is a schematic cross-sectional view of a double-bit non-volatile memory cell according to one preferred embodiment of this invention. As shown in FIG. 3, the memory cell includes a substrate 300, a pair of stacked gates 310a and 310b, a pair of source/drain regions 320a and 320b and a doped region 333. The stacked gate 310a/b includes, from bottom to top, a tunnel oxide layer 312a/b, a floating gate 314a/b, an inter-gate dielectric layer 316a/b and a control gate 318a/b. The doped region 333 is located in the substrate 300 on each side of the stacked gate pair 310a and 310b. Both the source/drain region 320a/b and the doped region 333 are similarly doped, for example, n-doped. In addition, both the floating gate 314a/b and the control gate 318a/b are made from a material such as polysilicon while the inter-gate dielectric layer 316a/b is an oxide/nitride/oxide (ONO) composite layer, for example. Furthermore, the doped region 333 is used only for connecting the channels underneath the tunnel oxide layers 312a and 312b. Hence, width 'a' of the doped region 333 can be smaller than width 'b' of the source/drain region 320a/b.

The following is a description of two methods for programming the said double-bit non-volatile memory cell of this invention when the source/drain region 320a/b and the doped region 333 are n-doped.

Figure 4:
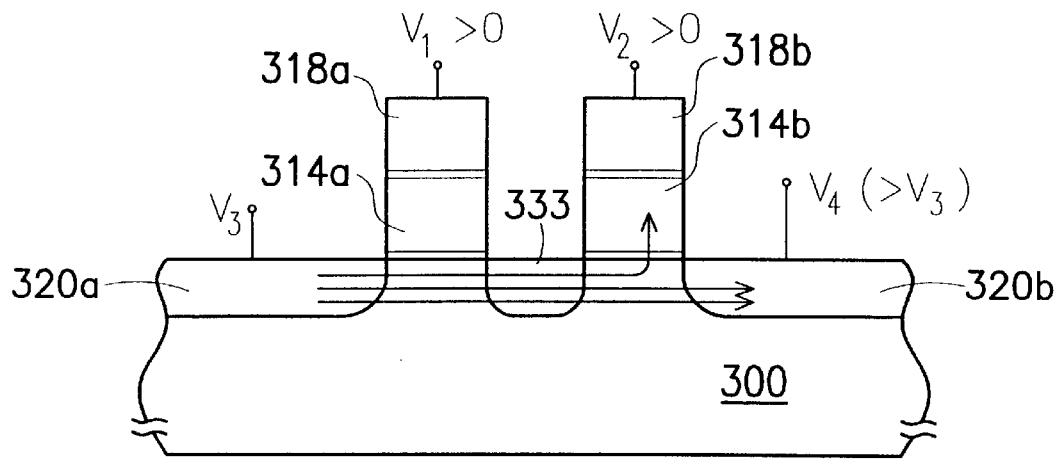
FIG. 4 is a schematic cross-sectional view illustrating a first method for programming the double-bit non-volatile memory cell according to this invention.

FIG. 4 is a schematic cross-sectional view illustrating a first method for programming the double-bit non-volatile memory cell according to this invention. The first programming method is actually a channel hot electron (CHE) injection method. Bias voltages $V_1$ and $V_2$ are applied to the control gate 318a and 318b respectively so that the channel underneath both the floating gates 314a and 314b is simultaneously opened. If data need to be written into the floating gate 314b, a bias voltage $V_3$ such as a ground voltage is applied to the source/drain region 320a on one side of the control gate 318a. In the meantime, a bias voltage $V_4$ greater than the bias voltage $V_3$ is applied to the source/drain region 320b on one side of the control gate 318b. Ultimately, electrons flow from the source/drain region 320a to the source/drain region 320b shown by the arrow in FIG. 4. In here, voltage difference between $V_4$ and $V_3$ must be sufficiently large for electrons flowing into region underneath the floating gate 314b to acquire enough energy to produce hot electrons. These hot electrons have sufficient energy to cross into the floating gate 314b but not enough to generate hot electrons underneath the floating gate 314a.

Similarly, to write into the floating gate 314a, the channel underneath both the floating gates 314a and 314b must be opened simultaneously and a reverse voltage applied to the source/drain region 320a and 320b respectively. This time hot electrons are generated only in the channel underneath the floating gate 314a and these hot electrons are injected into the floating gate 314a. In addition, writing into the floating gate 314a is unaffected by written data in the floating gate 314b. Data can be written into the floating gate 314a as long as a sufficiently large bias voltage is applied to the floating gate 314b so that the channel underneath the floating gate 314b is opened. In other words, writing data into the floating gate 314b can be carried out after data is written into the floating gate 314a.

Figure 5:
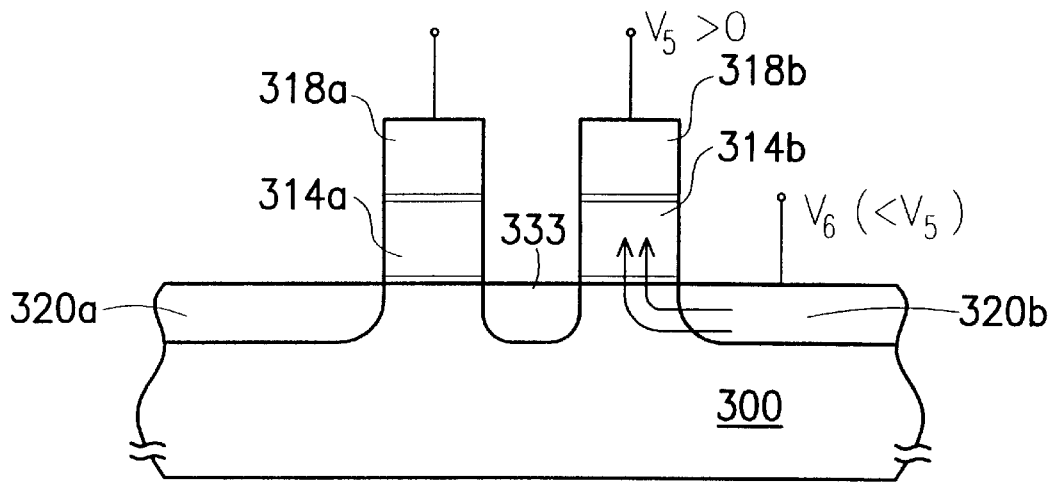
FIG. 5 is a schematic cross-sectional view illustrating a second method for programming the double-bit non-volatile memory cell according to this invention.

FIG. 5 is a schematic cross-sectional view illustrating a second method for programming the double-bit non-volatile memory cell according to this invention. A bias voltage $V_5$ greater than zero is applied to the control gate 318b. In the meantime, a bias voltage such as a ground voltage $V_6$ smaller than $V_5$ is applied to the source/drain region 320b on one side of the floating gate 318b. Here, the difference between the voltages $V_5$ and $V_6$ must be sufficiently large to permit electrons to flow from the source/drain region 320b to the floating gate 314b by Fowler-Nordheim tunneling.

Similarly, to write data into the floating gate 314a, a bias voltage sufficiently higher than the voltage at the source/ drain region 320a is applied to the control gate 318a. The writing of data into the floating gate 314a is unrelated to the floating gate 314b and the control gate 318b. Hence, the writing of data into the floating gate 314a is unaffected by the written state of the floating gate 314b. In other words, data can be written into the floating gate 314a after data is written into the floating gate 314b.

The following is a description of a method of reading data from the said double-bit non-volatile memory cell of this invention when the source/drain region 320a/b and the doped region 333 are n-doped. Because of the presence of electric charges, the threshold voltage (bias voltage at the control gate 318a (318b) when the channel opens) of the channel underneath the floating gate 314a (314b) when the gate is in a written state is greater than the threshold voltage in the erased state. Here, the threshold voltage at the written state is denoted by $V_{Twrite}$ and the threshold voltage at the erased state is denoted by $V_{Terase}$, wherein $V_{Twrite} > V_{Terase}$.

Figure 6:
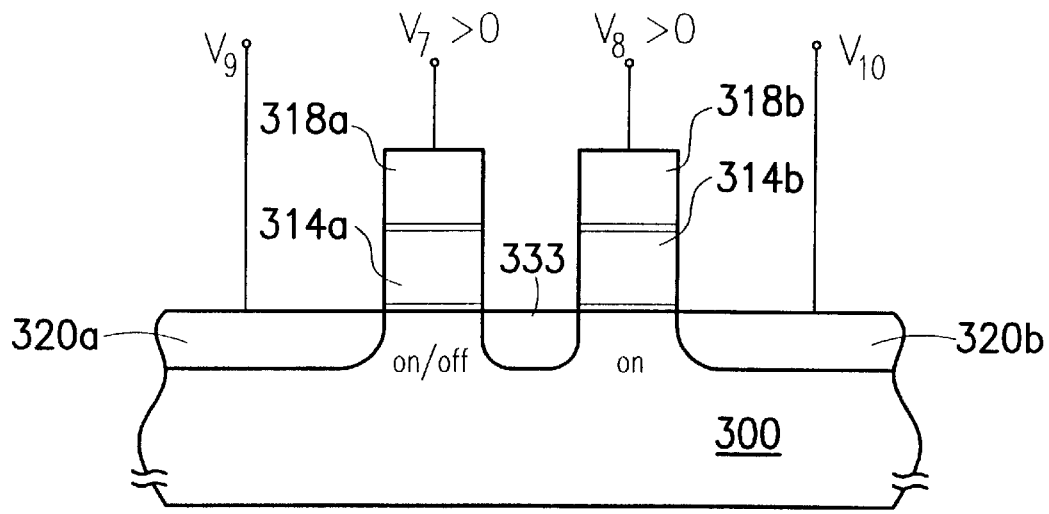
FIG. 6 is a schematic cross-sectional view illustrating a method for reading data from the double-bit non-volatile memory cell according to this invention.

FIG. 6 is a schematic cross-sectional view illustrating a method for reading data from the double-bit non-volatile memory cell according to this invention. In FIG. 6, the process of reading data from the floating gate 314a is chosen as an example. A positive bias voltage $V_8$ greater than $V_{Twrite}$ is applied to the control gate 318b so that the opening of the channel underneath the floating gate 314b is ensured. In the meantime, a positive bias voltage $V_7$ is applied to the control gate 318a. In general, $V_{Twrite} > V_7 > V_{Terase}$. Different bias voltages $V_9$ and $V_{10}$ are applied to the source/drain regions 320a and 320b respectively. The state of the floating gate 314a is determined by whether the channel between the source/drain regions 320a and 320b are conductive or not.

Since the control gate 318b has a voltage $V_8$ such that $V_8 > V_{Twrite} > V_{Terase}$, the channel underneath the floating gate 314b is opened independent of any data written into the floating gate 314b. On the other hand, the control gate 318a has a voltage $V_7$ such that $V_{Twrite} > V_7 > V_{Terase}$. The channel is opened when the floating gate 314a is in an erased state while the channel is closed when the floating gate 314a is in the written state. Because both the doped region 333 and the source/drain region 320a/b are identically doped, conduction between the source/drain regions 320a and 320b indicates the floating gate 314a is in the erased state. Conversely, if no conductive channel is formed between the source/drain regions 320a and 320b, the floating gate 314a is in the written state.

Similarly, to read stored data from the floating gate 314b, a bias voltage $V_7$ greater than $V_{Twrite}$ is applied to the control gate 318a. In the meantime, a bias voltage $V_8$ greater than $V_{Terase}$ but smaller than $V_{Twrite}$ is applied to the control gate 318b. Data value contained within the floating gate 314b is determined by the presence or absence of a conductive channel between the source/drain regions 320a and 320b.

The double-bit non-volatile memory of this invention uses two stacked gates 310a and 310b but uses just a pair of source/drain regions 320a and 320b. Therefore, a through channel is formed between the two source/drain regions 320a and 320b only when the channel underneath both the first floating gate 314a and the second floating gate 314b are opened. Since the probability of having both floating gates 314a and 314b over-erased is small, the chance of maintaining a permanent conductive channel between the source/drain terminals 320a and 320b is slim. Thus, errors in data determination are greatly reduced. Moreover, one of the stacked gates 310a (310b) can be regarded as a transfer gate because the transfer gate actually prevents the other transfer gate from being over-erased.

In addition, the double-bit memory cell is capable of holding two binary bits with one stacked gate 310a (310b) serving as the transfer gate of the other stacked gate 310b (310a). Unlike the cell of a conventional split-gate having an additional transfer gate on one side of the control gate, the area for holding each bit is smaller.

Furthermore, unlike a conventional split-gate design that demands a patterning of the floating gate before patterning the control gate and the transfer gate together, one stacked gate 310a (310b) serves as the transfer gate of the other stacked gate 310b (310a). Hence, the stacked gate 310a/b may be produced by a self-alignment method so that any non-conformity between different electrical devices is minimized.

Furthermore, the doped region 333 serves as a current path only. Hence, the doped region 333 can be doped identically as the source/drain region 320a/b. In other words, width 'a' of the doped region 333 can be smaller than width 'b' of the source/drain region 320a/b. Ultimately, the area occupied by each double-bit non-volatile memory cell is smaller than the conventional split gate cell design as well as the conventional stacked gate design.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of reading data from a double-bit non-volatile memory cell, wherein the double-bit non-volatile memory cell comprises of:

a substrate;

a first stacked gate and a second stacked gate on the substrate, wherein the first stacked gate includes a first floating gate and a first control gate and the second stacked gate includes a second floating gate and a second control gate, the channel underneath the first/the second floating gate is at a first threshold voltage when the first/the second floating gate is in the erased state, and the channel underneath the first/the second floating gate is at a second threshold voltage greater than the first threshold voltage when the first/second floating gate is in the written state;

a doped region in the substrate located between the two stacked gates; and a pair of source/drain regions located on each side of the stacked gate pair, wherein the two source/drain regions and the doped region are n-doped; and the steps of reading stored data from the first floating gate includes:

applying a read bias voltage at the first control gate, wherein the read bias voltage is greater than the first threshold voltage but smaller than the second threshold voltage;

applying a transfer bias voltage at the second control gate, wherein the transfer bias voltage is greater than the second threshold voltage so that the channel underneath the second floating gate is opened; and determining the state of the first floating gate by checking the presence or absence of a conductive channel between the two source/drain regions, wherein conduction between the two source/drain regions indicates an unwritten state for the first floating gate while non-conduction indicates a written state.

* * * * *